United States Patent
Tan et al.

(10) Patent No.: US 12,148,646 B2
(45) Date of Patent: Nov. 19, 2024

(54) ALIGNER APPARATUS

(71) Applicants: KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Avish Ashok Bharwani, Santa Clara, CA (US); George Chin, San Leandro, CA (US); Simon Jeyapalan, Newark, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 595 days.

(21) Appl. No.: 17/357,354

(22) Filed: Jun. 24, 2021

(65) Prior Publication Data
US 2022/0415690 A1  Dec. 29, 2022

(51) Int. Cl.
| | |
|---|---|
| *H01L 21/68* | (2006.01) |
| *B25J 9/16* | (2006.01) |
| *H01L 21/67* | (2006.01) |
| *H01L 23/544* | (2006.01) |

(52) U.S. Cl.
CPC .......... *H01L 21/681* (2013.01); *B25J 9/1692* (2013.01); *H01L 21/67288* (2013.01); *H01L 23/544* (2013.01); *H01L 2223/54433* (2013.01); *H01L 2223/54493* (2013.01)

(58) Field of Classification Search
CPC ............. H01L 21/681; H01L 21/67288; H01L 23/544; H01L 2223/54433; H01L 2223/54493; B25J 9/1692
See application file for complete search history.

(56) References Cited

U.S. PATENT DOCUMENTS

| | | | | |
|---|---|---|---|---|
| 5,365,672 A | * | 11/1994 | Kato | .............. H01L 21/681 |
| | | | | 33/549 |
| 7,161,668 B2 | * | 1/2007 | Meeks | .............. G01B 11/306 |
| | | | | 356/237.2 |
| 7,723,211 B2 | * | 5/2010 | Yamamoto | ........ H01L 21/67132 |
| | | | | 257/E21.53 |
| 7,968,859 B2 | * | 6/2011 | Young | ............... G01N 21/9503 |
| | | | | 250/221 |
| 2002/0125448 A1 | | 9/2002 | An | |
| 2015/0153729 A1 | * | 6/2015 | Kurahashi | ........ G05B 19/41875 |
| | | | | 700/110 |

FOREIGN PATENT DOCUMENTS

| | | |
|---|---|---|
| JP | 2002-299419 A | 10/2002 |
| JP | 2006-128423 A | 5/2006 |
| JP | 2015-195328 A | 11/2015 |
| WO | 2019/165484 A1 | 9/2019 |

* cited by examiner

*Primary Examiner* — Seung C Sohn
(74) *Attorney, Agent, or Firm* — METROLEX IP LAW GROUP, PLLC; Robert L. Scott, Esq.

(57) ABSTRACT

An aligner system includes a motor, a rotating device, a control device, and a sensor. The motor generates a rotational drive force. The rotating device 11 is rotated by the rotational drive force generated by the motor, while supporting a wafer. The control device controls rotation of the rotating device, and performs a process of setting a rotational phase of the wafer to a predetermined value. The sensor emits a plurality of light beams traveling in different directions toward an edge of the wafer, and receives the light beams to detect a defect in the edge of the wafer.

18 Claims, 4 Drawing Sheets

ALIGNER APPARATUS

BACKGROUND OF THE INVENTION

1. Field of the Invention

The present invention mainly relates to an aligner system including a sensor that detects wafer defects.

2. Description of the Related Art

JP2002-299419A discloses a multifunction wafer aligner. The multifunction wafer aligner corrects the centering of a wafer, aligns a wafer, and detects damage of a wafer. The multifunction wafer aligner detects damage of a wafer by using light-emitting sensors and light-receiving sensors. The light-emitting sensors, which are arrayed below a wafer, emit light upward. The light-receiving sensors, which are arrayed at positions facing a side surface of the wafer, receive light that is reflected by the wafer after the wafer is irradiated with light emitted from the light-emitting sensors. In a part of the wafer where a defect is present, a recess, etc. is present, and therefore a light reflection direction changes. This makes it possible that the defect in the wafer is detected based on the position at which the light-receiving sensor receives light.

WO2019/165484 discloses an apparatus for inspecting a wafer. This apparatus includes a light-emitting part and a detection part arranged such that a wafer can be interposed therebetween. The light-emitting part emits laser light from a plurality of positions toward an edge of the wafer. The detection part receives light that is the laser light being reflected or scattered by the edge of the wafer. Based on a result of detection by the detection part, a defect in the wafer can be detected with a high accuracy.

SUMMARY OF THE INVENTION

The multifunction wafer aligner according to JP2002-299419A cannot detect a defect in a wafer unless a large recess, etc. is present in the wafer. Moreover, in the multifunction wafer aligner according to JP2002-299419A, light is emitted perpendicularly to a surface of the wafer, and therefore it is difficult to detect fine particles on the surface of the wafer. The apparatus according to WO2019/165484 performs only inspection of a wafer. It therefore is necessary that the wafer, after inspected by the apparatus of WO2019/165484, is transported to an aligner system again. Consequently, a prolonged time is required to process the wafer.

The present invention has been accomplished in view of such circumstances, and primarily aims to provide an aligner system capable of detecting a defect in a wafer with a high accuracy while shortening a time required for inspection and alignment of the wafer.

The foregoing has described problems to be solved by the present invention. The following will describe solutions to the problems and advantageous effects thereof.

An aspect of the present invention provides an aligner system having the following configuration. The aligner system includes a motor, a rotating device, a control device, and a sensor. The motor generates a rotational drive force. The rotating device is rotated by the rotational drive force generated by the motor, while supporting a wafer. The control device controls rotation of the rotating device, and performs a process of setting a rotational phase of the wafer to a predetermined value. The sensor emits a plurality of light beams traveling in different directions toward an edge of the wafer, and receives the light beams to detect a defect in the edge of the wafer.

Detecting a defect in the edge of the wafer in the foregoing manner makes it possible that a plurality of positions on the wafer are inspected, and therefore a defect in the wafer can be detected with a high accuracy. Moreover, the aligner system performs not only alignment but also detection of a defect in the wafer, which can shorten a time required for inspection and alignment of the wafer.

According to the present invention, a defect in the wafer can be detected with a high accuracy, with shortening of the time required for the inspection and alignment of the wafer.

DETAILED DESCRIPTION OF THE PREFERRED EMBODIMENTS

Figure 1:
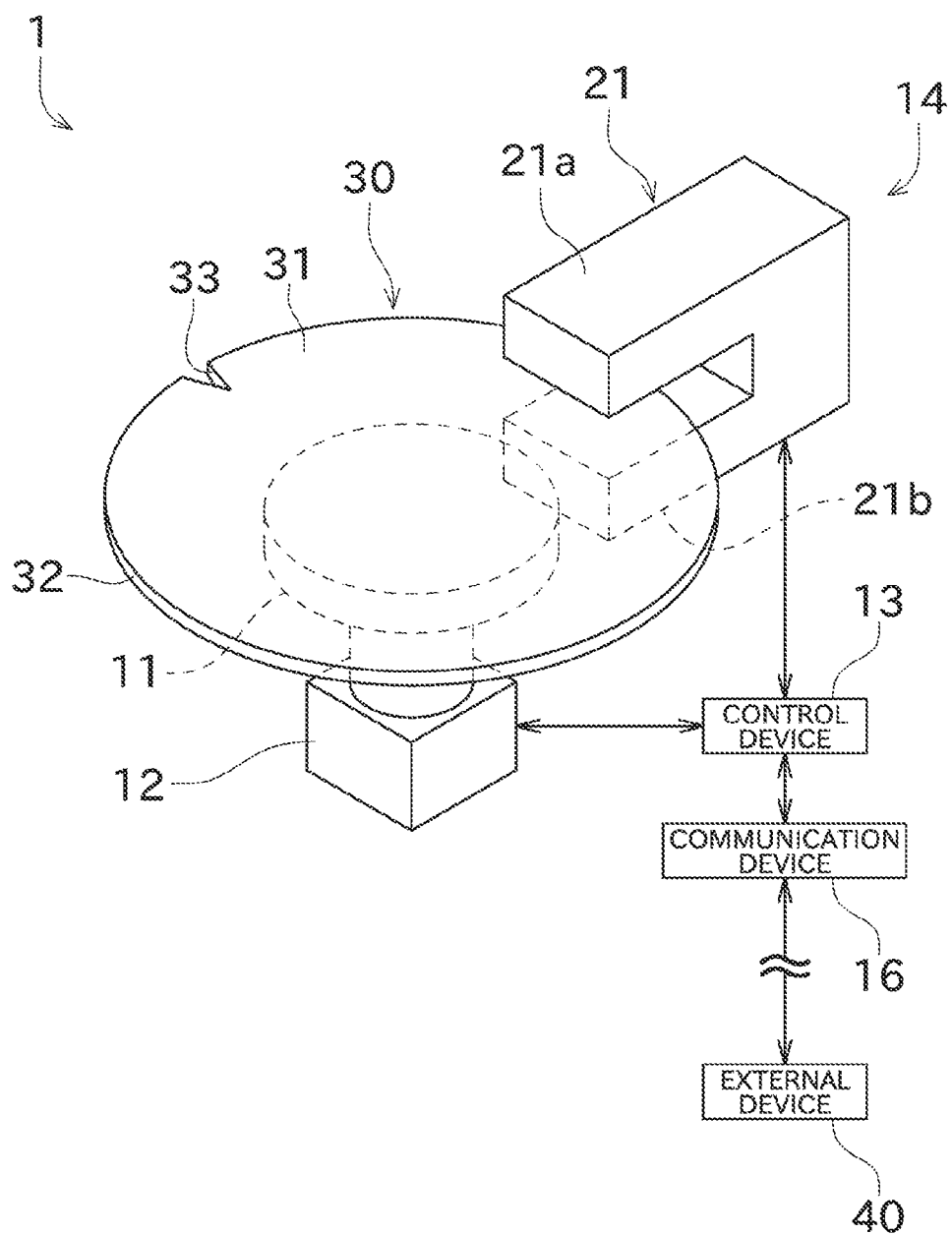
FIG. 1 is a perspective view of an aligner system according to a first embodiment.

Some embodiments of the present invention will be described with reference to the drawings. FIG. 1 is a perspective view of an aligner system 1 according to a first embodiment.

The aligner system (aligner apparatus) 1 shown in FIG. 1 is disposed in a work space such as a clean room. A robot (not shown) transports a wafer 30 to the aligner system 1.

The robot is a horizontal articulated robot of SCARA type, for example. The SCARA is an abbreviation of Selective Compliance Assembly Robot Arm. The wafer 30 is a semiconductor wafer in the shape of a circular thin plate. The wafer 30 may be a glass wafer instead of a semiconductor wafer.

The aligner system 1 is an apparatus that performs alignment on the wafer 30. The alignment means a process of acquiring a rotational phase of the wafer 30 and setting the rotational phase of the wafer 30 to a predetermined value. The rotational phase of the wafer 30 is a direction of the wafer 30 which varies as the wafer 30 rotates.

In the following description, two circular surfaces of the disk-shaped wafer 30 will be referred to as principal surfaces 31, while a surface connecting the principal surfaces 31 will be referred to as a side surface 32. The side surface 32 and radial end portions of the principal surfaces 31 of the wafer 30 will be collectively referred to as an edge of the wafer 30.

The edge of the wafer 30 has a notch 33. The notch 33 indicates a crystal orientation of a semiconductor. In a case where the wafer 30 has an orientation flat instead of the notch 33, the aligner system 1 may be configured to detect the orientation flat. The aligner system 1 may be configured to acquire not only the rotational phase of the wafer 30 but also a deviation of the center position of the wafer 30 from a reference point.

The aligner system 1 includes a rotating device 11, a motor 12, a control device 13, a sensor 14, and a communication device 16.

The rotating device 11 is a disk-shaped turntable. The robot places the wafer 30 onto the rotating device 11. Once the wafer 30 is placed on the rotating device 11, the rotating device 11 supports the wafer 30. The surface on which the wafer 30 is placed faces in the vertical direction. The rotating device 11 is rotatably supported by a worktable or the like. The shape of the rotating device 11 is not limited to a disk-like shape. For example, the rotating device 11 may be shaped like a rectangular plate. The rotating device 11 may be configured to grip the side surface of the wafer 30 to support the wafer 30.

The motor 12 generates a rotational drive force. The rotational drive force generated by the motor 12 is transferred to the rotating device 11. This allows the rotating device 11 to rotate about the vertical direction. Consequently, the rotational phase of the wafer 30 can be changed.

The motor 12 is controlled by the control device 13. The control device 13 includes an arithmetic unit such as a CPU, and a storage unit such as an HDD, an SSD, or a flash memory. The arithmetic unit executes a program stored in the storage unit, to control the aligner system 1. The control device 13 may control both the robot and the aligner system 1, or may control the aligner system 1 only.

The rotating device 11 is provided with an encoder (not shown). A detection result obtained by the encoder is transmitted to the control device 13. This allows the control device 13 to recognize the rotational phase of the rotating device 11 (i.e., the rotational phase of the wafer 30).

The sensor 14 inspects the wafer 30 placed on the rotating device 11. The sensor 14 includes a housing 21, light-projecting parts 22, and light-receiving parts 23.

The housing 21 is a box-shaped member in which parts included in the sensor 14 are stored. The housing 21, which has a substantially U-like shape, includes a first portion 21a and a second portion 21b that are opposed to each other with an interval therebetween. An inspection space 21c is formed between the first portion 21a and the second portion 21b. The edge of the wafer 30 supported by the rotating device 11 passes through the inspection space 21c. Accordingly, as the rotating device 11 is rotated once, the edge of the wafer 30 can be inspected throughout the circumference thereof.

Figure 2:
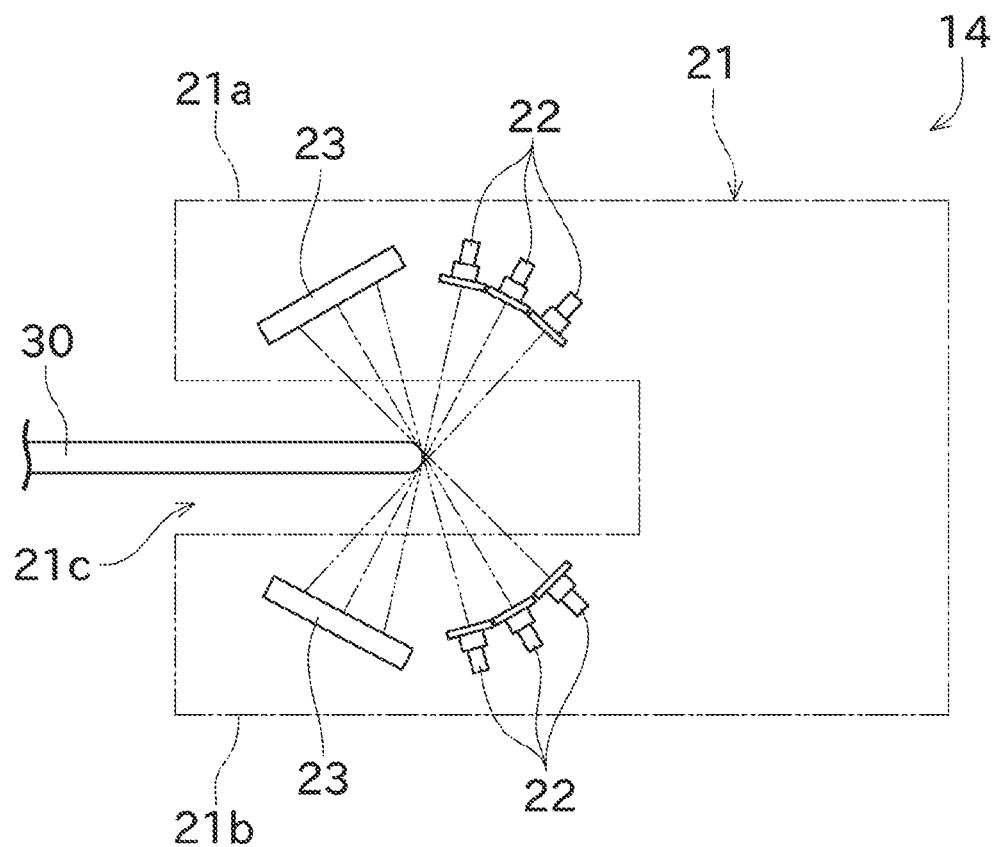
FIG. 2 is a side view showing an internal configuration of a sensor.

As shown in FIG. 2, a plurality of light-projecting parts 22 (specifically, three light-projecting parts 22) and a light-receiving part 23 are disposed in the first portion 21a. Likewise, a plurality of light-projecting parts 22 (specifically, three light-projecting parts 22) and a light-receiving part 23 are disposed in the second portion 21b.

The light-projecting parts 22 are laser generators, laser diodes, or SLDs (super luminescent diodes), for example. Thus, light (laser light) emitted from the light-projecting part 22 is directional, and has a narrower spectral bandwidth than that of light emitted from an LED. Each light-projecting part 22 emits light toward the edge of the wafer 30. The optical axis of the light emitted from the light-projecting part 22 is in contact with the wafer 30. Since the plurality of light-projecting parts 22 are at different positions, light beams emitted from the respective light-projecting parts 22 travel in different directions. The position of the contact point at which the optical axis of light is in contact with the wafer 30 varies depending on which light-projecting pan 22 has emitted the light.

The light-receiving part 23 receives light emitted from the light-projecting part 22, produces a current signal in accordance with the amount of light received (or a voltage signal obtained by converting the current signal), and outputs the signal to the control device 13. Light beams from the light-projecting parts 22 disposed in the first portion 21a are received by the light-receiving part 23 disposed in the second portion 21b. Light beams from the light-projecting parts 22 disposed in the second portion 21b are received by the light-receiving part 23 disposed in the first portion 21a.

The control device 13 is capable of distinguishing a current signal received from the light-receiving part 23 by which of the light-projecting parts 22 has emitted light based on which the current signal is produced. To be specific, the light-receiving part 23 includes a plurality of photodiodes, and each of the photodiodes is arranged at a position overlapping a traveling path of a light beam emitted from each of the light-projecting parts 22. With this configuration, which of the light-projecting parts 22 has emitted a light beam based on which a current signal is produced can be identified based on which of the photodiodes has outputted the current signal. Alternatively, the light-receiving part 23 may be composed of only one photodiode. In such a configuration, the light-projecting parts 22 emit light beams according to a predetermined schedule, and the receiving part 23 receives the light beams. Based on the schedule and a time at which a current signal is received, the control device 13 can identify which of the light-projecting parts 22 has emitted a light beam based on which a current signal is produced.

A light beam emitted from the light-projecting part 22 is influenced by a surface of the edge of the wafer 30 (for example, diffracted by the surface), and then is received by the light-receiving part 23. The presence of a defect in the surface of the edge of the wafer 30 changes the light beam to be received by the light-receiving part 23. The control device 13 can identify whether or not the surface of the edge of the wafer 30 has any defect, based on a current signal received from the light-receiving part 23. As described above, the position of the contact point at which the optical axis of light emitted from the light-projecting part 22 is in contact with the wafer 30 varies depending on which light-projecting part 22 has emitted the light. Accordingly, in this embodiment, a plurality of portions of the edge of the wafer 30 can be inspected for defects.

The sensor 14 is capable of detecting various defects. The sensor 14 is capable of detecting, for example, that the wafer 30 is warped, that the side surface 32 is uneven and has an inappropriate shape, that the amount of fine particles is greater than a predetermined value, that the wafer has an inappropriate diameter, and that a plurality of wafers bonded to one another have an inappropriate concentricity (in a case of a bonded wafer). Especially when light is emitted perpendicularly to a wafer surface as disclosed in JP2002-299419A, it is difficult to detect fine particles existing on the wafer. In this embodiment, light is emitted at an angle relative to the surface of the wafer 30, which makes it possible to detect fine particles existing on the wafer 30. When the side surface 32 of the wafer 30 has an inappropriate shape or when the amount of fine particles existing on the side surface 32 is greater than a predetermined value, there is a possibility that the principal surfaces 31 of the wafer 30 have the same defect, too. Accordingly, when the side surface 32 of the wafer 30 has this type of defect, the control device 13 determines that the principal surfaces 31 of the wafer 30 are likely to have the same type of defect, too.

The sensor 14 can detect not only defects in the wafer 30 but also whether or not the wafer 30 in the inspection space 21c has the notch 33 or an orientation flat. The notch 33 and the orientation flat have preset shapes. The shapes and sizes of the notch 33 and the orientation flat are quite different from those of a common defect. If a current signal that the light-receiving part 23 would output in response to the presence of the notch 33 or the orientation flat is preliminarily stored in (learned by) the control device 13, it is possible to distinguish whether the wafer 30 has a defect or has the notch 33 or the orientation flat. Accordingly, the control device 13 can inspect a defect in the wafer 30 while aligning the wafer 30 concurrently.

The communication device 16 is connected to the control device 13, or is built in the control device 13. The communication device 16 is capable of communication with an external device 40. The external device 40 is a device at a higher level than the aligner system 1, and is a device that collectively controls the aligner system 1 and other wafer processing apparatuses. The communication device 16 is, for example, a communication module including a wired-communication connector or a wireless-communication antenna, etc.

Figure 3:
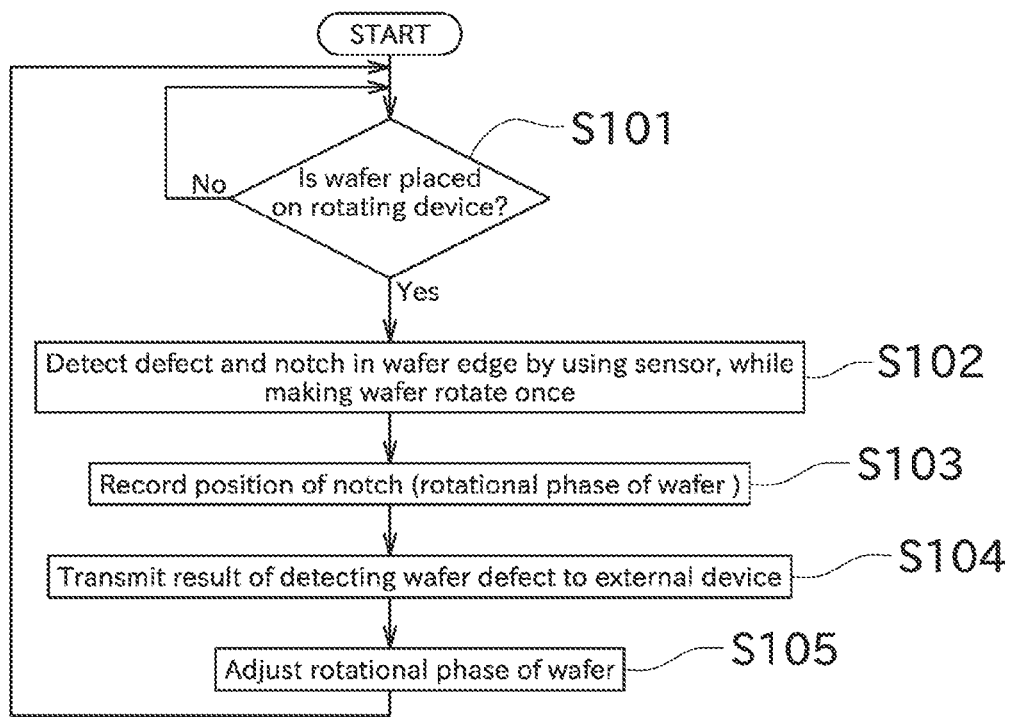
FIG. 3 is a flowchart showing a process that is executed by a control device.

Referring to FIG. 3, a description will be given to a control that the control device 13 performs for the defect inspection and alignment on the wafer 30.

First, the control device 13 determines whether or not the wafer 30 is placed on the rotating device 1 (S101). This determination is made based on whether or not an operation of placing the wafer 30 is completed. The operation of placing the wafer 30 is performed by the control device 13 controlling the robot, for example. In a case where a control device different from the control device 13 controls the robot, the control device 13 may receive a notification that the operation of placing the wafer 30 on the rotating device 11 is completed from the control device that controls the robot.

Then, the control device 13 controls the motor 12 to rotate the rotating device 11 such that the wafer 30 rotates once (S102). In addition, the control device 13 uses the sensor 14 to detect a defect and a notch 33 in the edge of the wafer 30 (S102). The sensor 14 measures the edge of the wafer 30 while the wafer 30 is rotating once, so that a defect in the wafer 30 can be inspected throughout the circumference thereof. The sensor 14 of this embodiment concurrently performs a process of detecting a defect in the edge and a process of detecting the notch 33. Accordingly, a time required for inspection and alignment of the wafer 30 can be shortened.

If the notch 33 is detected, the control device 13 records a position of the notch 33 based on a detection value of the encoder obtained at a time when the notch 33 is detected (S103). The position of the notch 33 is recorded as a rotational phase of the wafer 30 (rotating device 11) corresponding to the time when the notch 33 was detected.

Then, the control device 13 transmits a result of detecting a defect in the wafer 30 in step S102 to the external device 40 via the communication device 16 (S104). The result of detecting a defect in the wafer 30 is transmitted in association with identification information on the wafer 30. Here, whether or not the result of detecting a defect in the wafer 30 is at a negligible level for a product is determined by the external device 40. The aligner system 1 (control device 13) may continuously perform alignment if the external device 40 determines that it is negligible. Alternatively, the external device 40 may make the determination about a defect in the wafer 30 after the aligner system 1 (control device 13) completes alignment of one or more wafers 30.

Then, the control device 13 adjusts the rotational phase of the wafer 30, to set the rotational phase of the wafer 30 to a predetermined value (S105). Specifically, the control device 13 controls the motor 12 to rotate the wafer 30 such that the position of the notch recorded in step S103 can be toward a predetermined direction.

In the manner as thus far described, alignment and inspection of the wafer 30 can be performed by the same apparatus. This can shorten the time required to process the wafer 30, as compared to when the alignment and the inspection of the wafer 30 are performed by different apparatuses, respectively. Especially the sensor 14 is configured to emit a plurality of light beams traveling in different directions toward the wafer 30 and detect a defect in the wafer 30. The sensor 14, therefore, can precisely detect various defects in the wafer 30.

Figure 4:
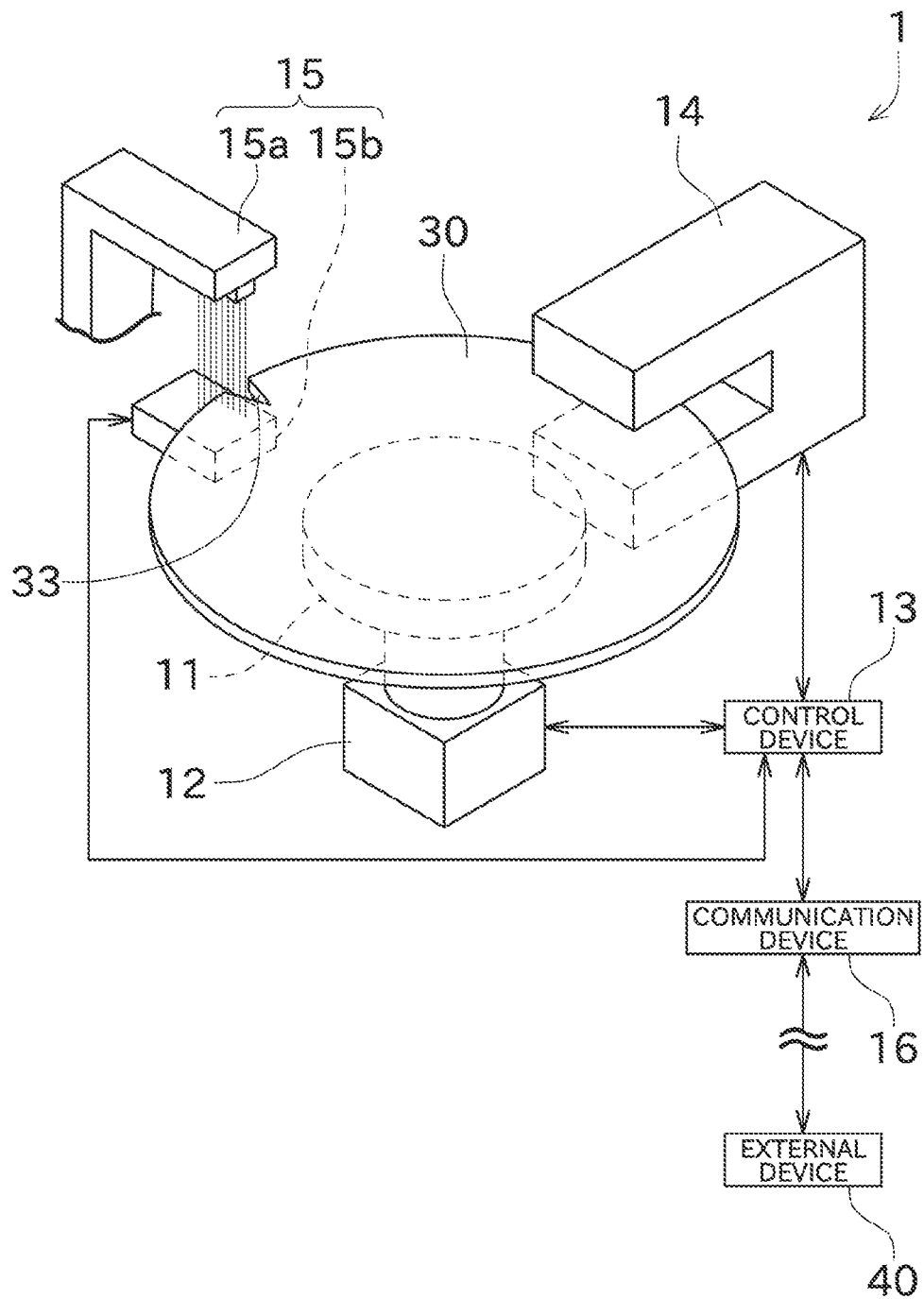
FIG. 4 is a perspective view of an aligner system according to a second embodiment.

A second embodiment will now be described with reference to FIG. 4.

In the first embodiment, the same sensor is used as both a sensor for detecting a defect in the wafer 30 and a sensor for detecting the notch 33 of the wafer 30. In the second embodiment, a sensor for detecting a defect in the wafer 30 and a sensor for detecting the notch 33 of the wafer 30 are separate. To be specific, a sensor 14 equivalent to that of the first embodiment is used to detect a defect in the wafer 30, while a line sensor 15 is used to detect the notch 33 of the wafer 30.

The line sensor 15 is a transmissive type photometry sensor. The line sensor 15 includes a light-projecting part 15a and a light-receiving part 15b.

The light-projecting part 15a emits light toward the light-receiving part 15b. Light emitted by the light-projecting part 15a has a linear cross-section. The wafer 30 is disposed between the light-projecting part 15a and the light-receiving part 15b.

The light-receiving part 15b receives a portion of the light emitted from the light-projecting part 15a, the portion being not blocked by the wafer 30. The light-receiving part 15b produces a current signal in accordance with the amount of light received (or a voltage signal obtained by converting the current signal), and outputs the signal to the control device 13. If the notch 33 is present between the light-projecting part 15a and the light-receiving part 15b, a reduced amount of light is blocked by the wafer 30, and therefore the light-receiving part 15b outputs a current signal having a greater value. Thus, it is possible to identify the position (rotational phase) of the notch 33 based on the output value of the light-receiving part 15b. In a case where the center position of the wafer 30 is deviated, the light-receiving part 15b outputs a current signal whose value is constantly varying as the wafer 30 rotates. This allows the control device 13 to detect the deviation of the center position of the wafer 30.

In the second embodiment, the two functions of the sensor 14 are distributed to two sensors. With this configuration, the function or setting of the sensor 14 can be specialized in detecting a defect in the wafer 30. As a result, a defect in the wafer 30 can be detected with a further improved accuracy. It should be noted that a control about the defect detection and alignment on the wafer 30 is the same as that of the first embodiment.

As thus far described, the aligner system 1 according to this embodiment includes the motor 12, the rotating device 11, the control device 13, and the sensor 14. The motor 12 generates a rotational drive force. The rotating device 11 is rotated by the rotational drive force generated by the motor 12, while supporting the wafer 30. The control device 13 controls rotation of the rotating device 11, and performs a process of setting the rotational phase of the wafer 30 to a predetermined value. The sensor 14 emits a plurality of light beams traveling in different directions toward the edge of the wafer 30, and receives the light beams to detect a defect in the edge of the wafer 30.

Detecting a defect in the edge of the wafer 30 in the foregoing manner makes it possible that a plurality of positions on the wafer 30 are inspected, and therefore a defect in the wafer 30 can be detected with a high accuracy. Moreover, the aligner system 1 performs not only alignment but also detection of a defect in the wafer 30, which can shorten the time required for the inspection and alignment of the wafer 30.

In the aligner system 1 according to this embodiment, the control device 13 causes the wafer 30 to rotate at least once, before setting the rotational phase of the wafer 30 to the predetermined value. While the control device 13 is causing the wafer 30 to rotate once, the sensor 14 keeps detecting a defect in the edge of the wafer 30.

With this, the wafer 30 can be inspected and aligned efficiently. In addition, the wafer 30 can be inspected throughout the circumference thereof.

In the aligner system 1 according to this embodiment, the control device 13 sets the rotational phase of the wafer 30 to the predetermined value based on the orientation flat or the notch 33 formed in the wafer 30. The orientation flat or the notch 33 is detected by using the sensor 14.

This configuration needs a reduced number of sensors, and thus can reduce the costs for the aligner system.

The aligner system 1 according to this embodiment includes the communication device 16 that communicates with the external device 40. The communication device 16 transmits to the external device 40 a result of detecting a defect in the edge of the wafer 30 in association with identification information on the wafer 30.

Accordingly, the external device 40 can determine whether or not the result of detecting a defect in the wafer 30 is at a negligible level for a product.

In the aligner system 1 according to this embodiment, the sensor 14 detects a defect in the side surface 32 of the wafer 30, without detecting a defect in the principal surfaces 31 of the wafer 30. The control device 13 determines the presence or absence of a defect in the principal surfaces 31 of the wafer 30 based on a defect in the side surface 32 of the wafer 30.

This configuration can shorten the time required for the inspection, as compared to a configuration that inspects the entire principal surfaces 31 of the wafer 30. When a larger amount of fine particles than a predetermined value are accumulated on the principal surfaces 31 of the wafer 30, it is likely that a larger amount of fine particles than the predetermined value are accumulated on the edge of the wafer 30, too. Accordingly, a sufficient accuracy of inspection can be obtained.

While some preferred embodiments of the present invention have been illustrated above, the configurations described above may be modified, for example, as follows.

In the above-described embodiments, light beams that are emitted by the light-projecting parts 22 and then received by the surface of the wafer 30 are received by the receiving part 23. Alternatively, it may be possible that light beams that are emitted by the light-projecting parts 22 and then reflected by the surface of the wafer 30 are received by the receiving part 23.

In the above-described embodiments, the light-projecting parts 22 and the light-receiving part 23 are disposed in the first portion 21a, while the light-projecting parts 22 and the light-receiving part 23 are disposed in the second portion 21b. Alternatively, it may be possible that the light-projecting parts 22 are disposed in the first portion 21a, while the light-receiving parts 23 are disposed in the second portion 21b (or vice versa).

The flowchart illustrated in the above-described embodiments is just an example, and the processes can be partially omitted or changed, or a new process can be added. For example, in the above-described embodiments, the process of detecting a defect in the wafer 30 and the process of detecting the notch 33 are performed concurrently. Alternatively, it may be possible that the process of detecting a defect in the wafer 30 is performed first, and the process of detecting the notch 33 of the wafer 30 is performed subsequently. It may be also possible to change the order of the process in step S104 and the process in step S105.

What is claimed is:

1. An aligner system comprising:
a motor that generates a rotational drive force;
a rotating device that is rotated by the rotational drive force generated by the motor, while supporting a wafer;
a control device that controls rotation of the rotating device, and performs operations comprising:
concurrently, during a single rotation of the wafer, detecting a notch or orientation flat in the edge of the wafer indicating an alignment of the wafer, and detecting a defect in the edge of the wafer; and
setting a rotational phase of the wafer to a predetermined value based on the detected notch or orientation flat; and
a sensor that emits a plurality of light beams traveling in different directions toward an edge of the wafer, and receives the light beams to detect the notch or orientation flat, and the defect in the edge of the wafer.

2. The aligner system according to claim 1, wherein
the control device performs operations further comprising recording a position of the detected notch or orientation flat; and
the control device performs operations such that setting the rotational phase of the wafer to the predetermined value comprises adjusting the rotation phase of the wafer to the predetermined value based on the recorded position of the detected notch or orientation flat.

3. The aligner system according to claim 1,
further comprising a communication device that communicates with an external device, wherein
the communication device transmits to the external device a result of detecting a defect in the edge of the wafer in association with identification information on the wafer.

4. The aligner system according to claim 1, wherein
the sensor detects a defect in a side surface of the wafer, without detecting a defect in a principal surface of the wafer, and
the control device determines the presence or absence of a defect in the principal surface of the wafer, based on a defect in the side surface of the wafer.

5. The aligner system according to claim 1, wherein
each of the plurality of light beams traveling in the different directions toward the edge of the wafer produces a representative current signal when received by the sensor, and
the control device is configured to detect the defect in the edge of the wafer based on the representative current signal.

6. The aligner system according to claim 5, wherein
the sensor comprises a plurality of light receiving elements, and
the representative current signal comprises a different current signal based on which of the plurality of different light receiving elements receives the respective light beam.

7. The aligner system according to claim 5, wherein
the sensor comprises a single light receiving element,
each of the plurality of light beams is transmitted at a different time, and
the representative current signal is based on the different time at which the respective light beam is received by the single light receiving element.

8. A control method for performing defect inspection and alignment of a wafer, the method comprising:
controlling a motor to generate a rotational drive force to rotate a rotating device supporting a wafer;
concurrently performing operations comprising:
controlling the motor to generate a single rotation of the wafer;
detecting a notch or orientation flat in an edge of the wafer indicating an alignment of the wafer; and
detecting a defect in the edge of the wafer; and
setting a rotational phase of the wafer to a predetermined value based on the detected notch or orientation flat in the edge of the wafer.

9. The control method according to claim 8, further comprising
recording a position of the detected notch or orientation flat as the rotation phase of the wafer, wherein
setting the rotational phase of the wafer to the predetermined value comprises adjusting the rotation phase of the wafer to the predetermined value based on the recorded rotation phase.

10. The control method according to claim 8,
transmitting to an external device a result of detecting the defect in the edge of the wafer in association with identification information on the wafer.

11. The control method according to claim 8, wherein
detecting a defect in the edge of the wafer comprises detecting a defect in a side surface of the wafer, without detecting a defect in a principal surface of the wafer, and
the method further comprises determining the presence or absence of a defect in the principal surface of the wafer, based on a defect in the side surface of the wafer.

12. The control method according to claim 8, wherein detecting the notch or orientation flat and detecting the defect comprises detecting, by a sensor that emits a plurality of light beams traveling in different directions toward the edge of the wafer, and receives the light beams, the notch or orientation flat, and the defect.

13. A sensor for inspecting an edge of a wafer, comprising:
a housing;
a plurality of light projecting parts; and
a light receiving part, wherein
each of a plurality of light beams emitted from respective ones of the plurality of light projecting parts travels in a different direction toward the edge of the wafer;
each of the plurality of light beams produces a representative current signal when received in the light receiving part, and
a defect in the edge of the wafer is detectable based on the one or more of the representative current signals.

14. The sensor according to claim 13, wherein
the light receiving part comprises a plurality of light receiving element corresponding to the light projecting parts,
each light receiving element of the plurality of light receiving elements generates a different current signal, and
the representative current signal is based on one or more of the different current signals.

15. The sensor according to claim 13, wherein
each of the plurality of light beams is emitted from respective ones of the plurality of light projecting parts at different times,
the light receiving part comprises a single light receiving element, and
the representative current signal is based on the different time at which the respective light beam is received by the single light receiving element.

16. The sensor according to claim 13, wherein the housing comprises a box-shaped member in which the plurality of light projecting parts and the light receiving part are housed.

17. The sensor according to claim 13, wherein, the housing has a substantially U shape, and comprises a first portion and a second portion that are opposed to each other with an inspection space therebetween through which the edge of the wafer passes.

18. The sensor according to claim 13, wherein the plurality of light-projecting parts are disposed in the first portion and the light receiving part is disposed in the second portion.

* * * * *